United States Patent
Hynecek

(10) Patent No.: US 11,037,977 B2
(45) Date of Patent: Jun. 15, 2021

(54) STACKED IMAGE SENSOR CAPABLE OF SIMULTANEOUS INTEGRATION OF ELECTRONS AND HOLES

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 178 days.

(21) Appl. No.: 16/054,025

(22) Filed: Aug. 3, 2018

(65) Prior Publication Data
US 2020/0043968 A1   Feb. 6, 2020

(51) Int. Cl.
| | | |
|---|---|---|
| H01L 27/146 | (2006.01) | |
| H04N 5/378 | (2011.01) | |
| H01L 27/148 | (2006.01) | |

(52) U.S. Cl.
CPC .... *H01L 27/14634* (2013.01); *H01L 27/1464* (2013.01); *H01L 27/14609* (2013.01); *H01L 27/14689* (2013.01); *H01L 27/14831* (2013.01); *H04N 5/378* (2013.01); *H01L 27/14621* (2013.01); *H01L 27/14627* (2013.01)

(58) Field of Classification Search
CPC ......... H01L 27/14634; H01L 27/14609; H01L 27/14689; H01L 27/1464; H01L 27/14831; H01L 27/14627; H01L 27/14621; H01L 27/1461; H01L 27/14612; H01L 27/14636; H01L 27/1463; H04N 5/378; H04N 5/3742
See application file for complete search history.

(56) References Cited

U.S. PATENT DOCUMENTS

| | | | |
|---|---|---|---|
| 7,439,561 B2 | 10/2008 | Adkisson | |
| 7,633,042 B2 | 12/2009 | Adkisson | |
| 8,513,761 B2* | 8/2013 | Roy | H01L 27/1463 257/452 |
| 2015/0236058 A1* | 8/2015 | Hu | H01L 27/14612 250/208.1 |
| 2017/0170223 A1* | 6/2017 | Hynecek | H01L 27/1464 |
| 2017/0186806 A1* | 6/2017 | Lalanne | H04N 5/3745 |

OTHER PUBLICATIONS

Frederic Lalanne, et al., A native HDR 115dB 3.2um BSI pixel using electron and hole collection, International Image Sensor Society Workshop, 2017, pp. 278-281, IISS, Hiroshima, Japan.

* cited by examiner

*Primary Examiner* — Jennifer D Bennett
(74) *Attorney, Agent, or Firm* — Noblitt & Newson, PLLC; Hettie L. Haines

(57) ABSTRACT

Various embodiments of the present technology may comprise methods and apparatus for an image sensor capable of simultaneous integration of electrons and holes. According to an exemplary embodiment, the image sensor comprises a backside-illuminated hybrid bonded stacked chip image senor comprising a pixel circuit array, and each pixel circuit comprising a charge storage capacitor oriented in a vertical direction in a deep trench isolation region. Both the electrons and holes are integrated (collected) using a global shutter operation, and the charge storage capacitor is used for storing a signal generated by the holes.

7 Claims, 4 Drawing Sheets

STACKED IMAGE SENSOR CAPABLE OF SIMULTANEOUS INTEGRATION OF ELECTRONS AND HOLES

BACKGROUND OF THE TECHNOLOGY

Electronic devices, such as cellular telephones, cameras, and computers, commonly use image sensors to capture images by sensing light. A typical imager sensor includes a focal plane array of pixels, and each pixel includes a photosensor, such as a photogate, photoconductor, or photodiode, for accumulating photo-generated charge in a portion of the substrate. When photons impinge on the photosensor, electron-hole pairs are generated. Conventional image sensors convert the electrons that are integrated (collected) in the pixels into a voltage, and the holes are generally discarded into the substrate.

After completion of integration cycle, collected electron charge is converted into a voltage, which is supplied to an output terminal of the image sensor. In a CMOS image sensor, the charge-to-voltage conversion is accomplished directly in the pixels themselves and the analog pixel voltage is transferred to the output terminal through various pixel addressing and scanning schemes. The analog signal can also be converted on-chip to a digital equivalent before reaching the chip output.

The pixels utilize a buffer amplifier, typically a source follower (SF) transistor to drive the sense lines that are connected to the pixels by suitable addressing transistors. After charge-to-voltage conversion is completed and the resulting signal is transferred out from the pixels, the pixels are reset in order to be ready for accumulation of new charge. In pixels that utilize a floating diffusion (FD) node as a charge detection node, the reset is accomplished by turning on a reset transistor that conductively connects the FD node to a voltage reference, which is typically the pixel SF drain node. This step removes collected charge; however, it generates kTC-reset noise. This kTC-reset noise is generally removed from the signal by a correlated double sampling (CDS) signal processing technique in order to achieve the desired low noise performance.

The typical CMOS image sensors that utilize the CDS concept usually require three (3T) or four transistors (4T) in the pixel—one of which serves as a charge transferring transistor. However, it is difficult adapting it for the high dynamic range (HDR) operation, where a large amount of charge must be stored in the pixels. Conventional methods for addressing this issue include: assigning to some sensor rows or pixels in a group of pixels a shorter integration time; using a logarithmic charge-to-voltage conversion characteristic; and incorporating charge storage capacitors into the pixels. These conventional methods, however, are not ideal because one or more may result in sacrificing the low light level resolution, a shorter integration time may lead to missing the detection of some short pulse duration light sources; logarithmic charge-to-voltage conversion may result in higher signal noise; and/or increasing the overall size of the chip due to having elements that occupy a large area in the pixel.

BRIEF DESCRIPTION OF THE DRAWINGS

A more complete understanding of the present technology may be derived by referring to the detailed description when considered in connection with the following illustrative figures. In the following figures, same reference numbers refer to similar elements and steps throughout the figures.

DETAILED DESCRIPTION OF EXEMPLARY EMBODIMENTS

The present technology may be described in terms of functional block components and various signal processing steps. Such functional blocks may be realized by any number of components configured to perform the specified functions and achieve the various results. For example, the present technology may employ various semiconductor devices, transistors, capacitors, and the like, which may carry out a variety of functions. In addition, the present technology may be practiced in conjunction with any number of systems, such as portable devices, consumer electronics, automotive systems, surveillance systems, and the like, and the system described is merely one exemplary application for the technology. Further, the present technology may employ any suitable pixel architecture, readout scheme, and/or device layout.

Methods and apparatus for an image sensor according to various aspects of the present invention may provide improved dynamic range. The methods and apparatus for an image sensor according to various aspects of the present technology may operate in conjunction with any suitable camera application, such as a digital camera, a cellular telephone, a tablet computer, a web camera, a video camera, a video surveillance system, an automotive imaging system, a video gaming system with imaging capabilities, or any other desired imaging system. Further, methods and apparatus for the image sensor may be utilized with any suitable imaging system, such as a camera system, video system, machine vision, vehicle navigation, surveillance system, motion detection system, and the like.

Figure 1:
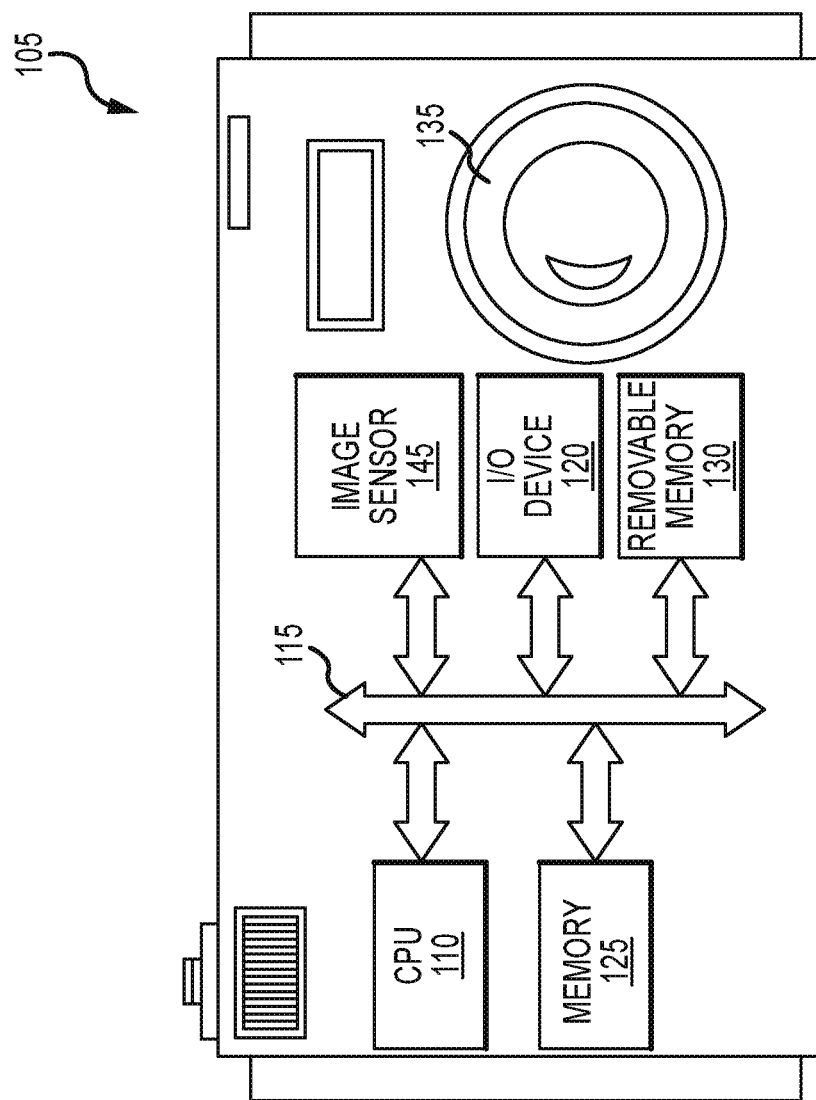
FIG. 1 representatively illustrates an imaging system in accordance with an exemplary embodiment of the present technology.

Referring now to FIG. 1, an exemplary imaging system 105 may comprise an electronic device, such as a digital camera, configured to capture image data. For example, the imaging system 105 may comprise a central processing unit (CPU) 110 that communicates with various devices over a bus 115. Some of the devices connected to the bus 115 may provide communication into and out of the system, for example an input/output (I/O) device 120.

The imaging system 105 may be configured to construct a digital high dynamic range (HDR) image using low light level signals and high light level signals. The imaging system 105 may further comprise a display screen (not shown) for viewing the digital image. The display screen may be coupled to and configured to send and/or receive information, such as image data, from the bus 115.

Other devices connected to the bus 115 may comprise a memory 125, for example a random access memory (RAM), and/or a removable memory 130, such as a USB drive, memory card, SD card, and the like. While the bus 115 is illustrated as a single bus, any number of busses may be used to provide communication paths to interconnect the devices.

The imaging system 105 may further comprise an image sensor 145 for capturing and conveying image data. For example, the image sensor 145 may comprise an array of pixel circuits (not shown) to detect the light and convey information that constitutes an image by converting the variable attenuation of photon flow (as they pass through or reflect off object) into electrical signals. The image sensor 145 may be implemented in conjunction with any appropriate technology, such as active pixel sensors in CMOS technology.

In various embodiments, the imaging system 105 may comprise a lens 135 to focus an image or scene on the image sensor 145. For example, light may enter the imaging system 105 through a lens 135 and strike the image sensor 145. The lens 135 may include a fixed and/or adjustable focus lens.

In various embodiments, the image sensor 145 may be configured to process image data. For example, the image sensor 145 may comprise an image signal processor (not shown) to perform image reconstruction, such as demosaicing, white balancing, noise reduction, color correction, and the like. The image sensor 145 may further comprise various signal processing circuits and/or systems, such as sample-and-hold circuitry, an analog-to-digital converter, an amplifier, and the like, used to convert the pixel charge to a digital image.

Figure 2:
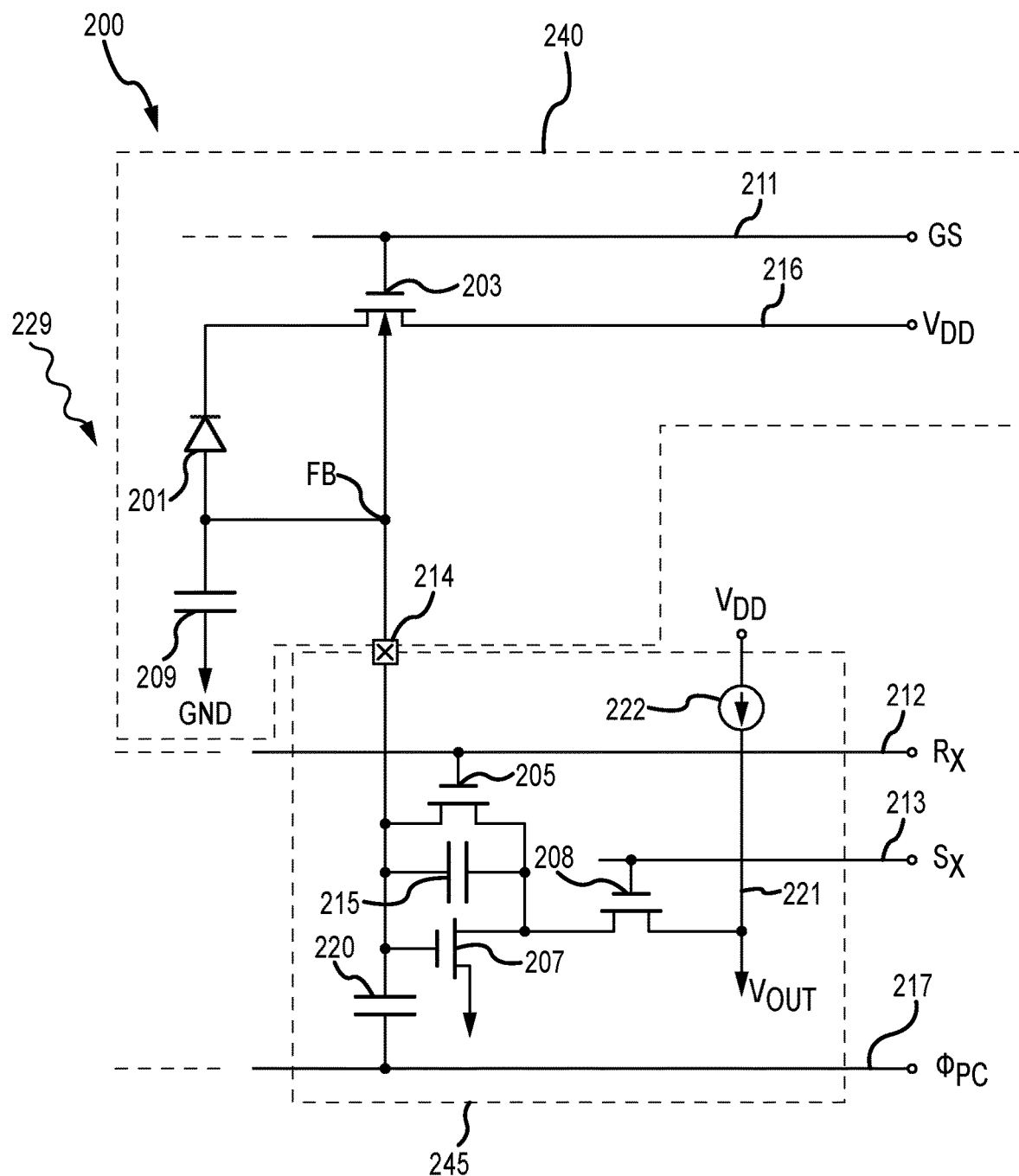
FIG. 2 is a simplified circuit diagram in accordance with an exemplary embodiment of the present technology.

Referring to FIG. 2, each pixel circuit 200 within the array may capture a portion of an image or scene. The pixel circuit 200 may comprise one or more integrated circuits, such as a signal processing circuit, a charge storage device, a charge-to-voltage conversion circuit, a charge transfer device, and the like, to detect light photons and convert the detected photons into a charge representing a pixel signal. For example the pixel circuit 200 may comprise a first portion 240 and a second portion 245. According to an exemplary embodiment, the first portion 240 comprises a photodetector 201, a charge transfer device 203, and a capacitor 209.

The photodetector 201 converts light (photons) into electric charge consisting of electrons and holes (electron-hole pairs), which may be referred to individually as electron charge and hole charge. The photodetector 201 may comprise, for example, a photodiode, a photogate, or any other appropriate device responsive to light. In an exemplary embodiment, the photodetector 201 comprises a pinned photodiode with a floating body FB (also referred to as a floating body node FB).

The charge transfer device 203, such as a field effect transistor, may be configured to transfer the electron charge from the photodetector 201 to a drain terminal via a signal line 216. The charge transfer device 203 may comprise a MOS transistor, comprising a gate terminal connected to a signal line 211, wherein the signal line is used to transmit a global shutter signal GS to operate the charge transfer device 203. The drain terminal of the charge transfer device 203 is biased through the signal line 216 connected to a supply voltage $V_{DD}$. For example, when the global shutter signal GS is biased HIGH, the charge transfer device 203 turns on to transfer electron charge from the photodetector 201 to the drain terminal.

The capacitor 209 may be used to store hole charge from the photodetector 201. The capacitor 209 may be connected to the floating body FB of the pixel circuit 200 and a ground potential node GND. The hole charge is thus converted to a voltage and stored on the capacitor 209. The hole charge represents all levels of illumination and the resulting signal may be used to construct the HDR image.

According to an exemplary embodiment, the second portion 245 of the pixel circuit 200 operates as a readout circuit. For example, the second portion 245 of the pixel circuit 200 may comprise an amplifying transistor 207 (such as an inverting amplifier transistor), a reset transistor 205, and a row select transistor 208. The second portion 245 of the pixel circuit 200 is connected to the floating body FB and configured to deliver (i.e., output) a corresponding hole charge-generated output voltage VOUT on a column sense line 221. The amplifying transistor 207, the reset transistor 205, and the row select transistor 208 may comprise a conventional MOSFET, each comprising a gate terminal, a source terminal, and a drain terminal.

The gate terminal of the reset transistor 205 may be connected to a second signal line 212, wherein the second signal line 212 is used to transmit a reset signal $R_X$ to the gate of the reset transistor 205. Similarly, the gate terminal of the row select transistor 208 may be connected to a third signal line 213, wherein the third signal line 213 is used to transmit a row select signal $S_X$ to the gate of the row select transistor 208.

In various embodiments of the present technology, the pixel circuit 200 may further comprise a current source 222 connected to and configured to provide a bias current to the second portion 245 of the pixel circuit 200, such as to the row select transistor 208. The current source 222 may be located at a chip periphery and supply the bias current to the amplifying transistor 207 through the row select transistor 208 from the column sense line 221.

According to an exemplary embodiment of the present technology, the second portion 245 of the pixel circuit 200 may further comprise a feedback capacitor 215 connected to the amplifying transistor 207. The feedback capacitor 215 controls a gain of the pixel circuit 200, and together, the feedback capacitor 215 and the amplifying transistor 207 may operate as a negative feedback amplifier. In alternative embodiments, the feedback capacitor and the amplifying transistor 207 may be replaced with a more sophisticated and/or complex amplifier, such as a low-noise differential operational amplifier or an amplifier with a nonlinear gain characteristic, to achieve low noise performance, eliminate random telegraph signal (RTS) noise, and increase the dynamic range of the pixel circuit 200. It may be advantageous to design the pixel circuit 200 in a stacked chip arrangement, as this arrangement may be more suitable for including complex circuits without sacrificing the pixel performance, such as the quantum efficiency, dynamic range, noise-suppressing ability, and the pixel size.

The second portion 245 of the pixel circuit 200 may further comprise a pre-charge capacitor 220 to increase a range of an output voltage swing of the amplifying transistor 207. The imaging system 105 may supply a pre-charge signal $\Phi_{pc}$ to the pre-charge capacitor 220 through a signal line 217.

In an exemplary embodiment, the pixel circuit 200 may be arranged on a first chip and a second chip, wherein the first and second chips are stacked vertically. In the present embodiments, the first and second chips may be bonded together with one or more types of bonding and/or electrical connections. For example, the pixel circuit 200 may comprise a hybrid bond 214 to connect the first chip to the second chip. According to an exemplary embodiment, the hybrid bond 214 is used to connect the pixel floating body FB, located on the first chip, to the readout circuit, which is located on the second chip. Additional connections may be located at the periphery of the first and second chips to provide other chip-to-chip circuit connections.

According to an exemplary embodiment, the first portion 240 of the pixel circuit 200, comprising the photodetector 201, the capacitor 209, and the charge transfer device 203 may be formed on the first chip. Additionally, the second portion 245 of the pixel circuit 200, comprising the reset transistor 205, the amplifying transistor 207, the row select transistor 208, the feedback capacitor 215, and the pre-charge capacitor 220 may be formed on the second chip. According to the present embodiments, the second chip may further comprise the current source 222. In various alternative embodiments, the current source 222 and other components and/or circuits could be located on a third chip (not shown) in a stacked chip arrangement.

Figure 3:
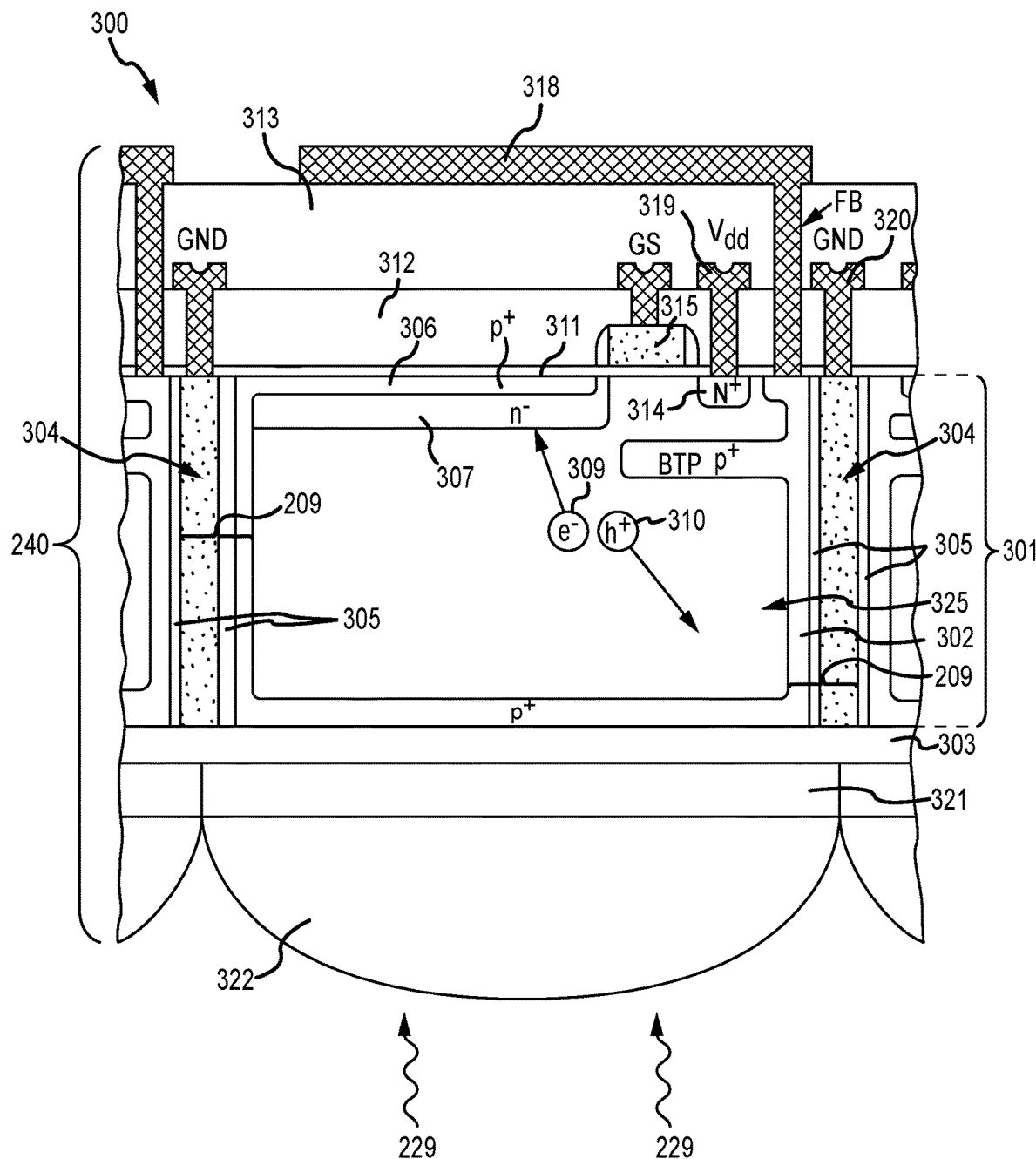
FIG. 3 is a cross-sectional view of a portion of a solid-state pixel circuit in accordance with an exemplary embodiment of the present technology.

Referring to FIGS. 2 and 3, a solid-state pixel structure 300 corresponding to the first portion 240 of the pixel circuit 200, comprises an epitaxial substrate layer 301, wherein a pixel body region 325 is formed. The epitaxial substrate layer 301 may be covered with a first oxide layer 303 on a first major surface and a second oxide layer 311 on an opposing second major surface, wherein each oxide layer 303, 311 isolates and/or protects the epitaxial substrate 301. The second oxide layer 311 also serves to isolate a polysilicon transfer gate 315 (corresponding to the gate of the charge transfer device 203) from the epitaxial substrate 301.

The pixel body region 325 may comprise various doped regions. For example, the pixel body region 325 may comprise a first p+ type doped layer 302 that extends along side walls of the pixel body region 325 and along a bottom region. The pixel body region 325 may further comprise a second p+ type doped region 306 along a portion of the second surface of the pixel body region 325. The first and second p+ type doped regions 302, 306 may be used to passivate the interface states and thus minimize the generation of dark current by these interface states.

The pixel body region 325 may further comprise an n-type doped layer 307 adjacent to the second p+ type doped layer 306. The second p+ type doped layer 306 and the n-type doped layer 307 form a pinned photodiode region that collects and stores the photon-generated electrons 309.

The first p+ type doped region 302 is connected to the hybrid bond pad 318 through via connection similar to the ground connection via 320. The hybrid bond pad 318 provides the connection for the floating body of each pixel circuit 200 to the second portion 245. In an exemplary embodiment, the hybrid bond pad 318 is located substantially over the second p+ type doped layer 306 to reflect photons (that may not have been absorbed during a first pass through the pixel body region 325 and generated electron-hole pairs) back to the photodiode region 325. This feature may be useful in an image sensor where near-infrared sensing capabilities are desired.

The pixel body region 325 may further comprise an n+ type doped region 314 that forms a drain terminal of the charge transfer device 203. The n+ type doped region 314 may be further connected to the supply voltage $V_{DD}$ by via 319.

The pixel body region 325 is isolated from a neighboring pixel body by a deep trench isolation region 304 that is filled with a doped polysilicon material, tungsten, or any other suitable conductive material. A third oxide layer 305 may be disposed on the interior walls of the deep trench isolation region 304 to isolate the doped polysilicon material from the pixel body region 325.

The deep trench isolation region 304, which is filled with a conductive material, may be connected to the ground bias potential through via 320. Via 320 may be filled with different types of conducting material, such as tungsten. Together, the deep trench isolation region 304, the first p+ type doped layer 302 and the third oxide layer 305 form the capacitor 209. Accordingly, the capacitor 209 is arranged vertically and substantially perpendicular to the first and second oxide layers 303, 311. Because of the vertical orientation of the capacitor 209, it is possible to achieve a large charge storage capacity and high dynamic range without sacrificing the pixel area exposed to light. This results in small sized pixels and high quantum efficiency, which result in improved sensor performance and lower cost.

The solid-state pixel structure 300 may further comprise a fourth oxide layer 312 and a fifth oxide layer 313 deposited adjacent to the second major surface of the epitaxial layer 301 to isolate various metal interconnects, such as the via 319, 320 and/or the hybrid bond pad 318 from each other.

The solid-state pixel structure 300 may further comprise a color filter 321 and a micro lens 322. In an exemplary embodiment, the color filter 321 is disposed adjacent to the first major surface of the epitaxial layer 301 and the first oxide layer 303, and the micro lens 322 is disposed on a surface of the color filter 321 that opposes the first oxide layer 303. This arrangement is commonly referred to as a "backside illuminated image sensor pixel." The micro lens 322 concentrates the impinging photons 229 to enter the pixel body region 325 and generate the electrons 309 and holes 310, which are simultaneously generated and integrated (collected) in the n− and p+ doped regions 307 and 302, respectively.

Figure 4:
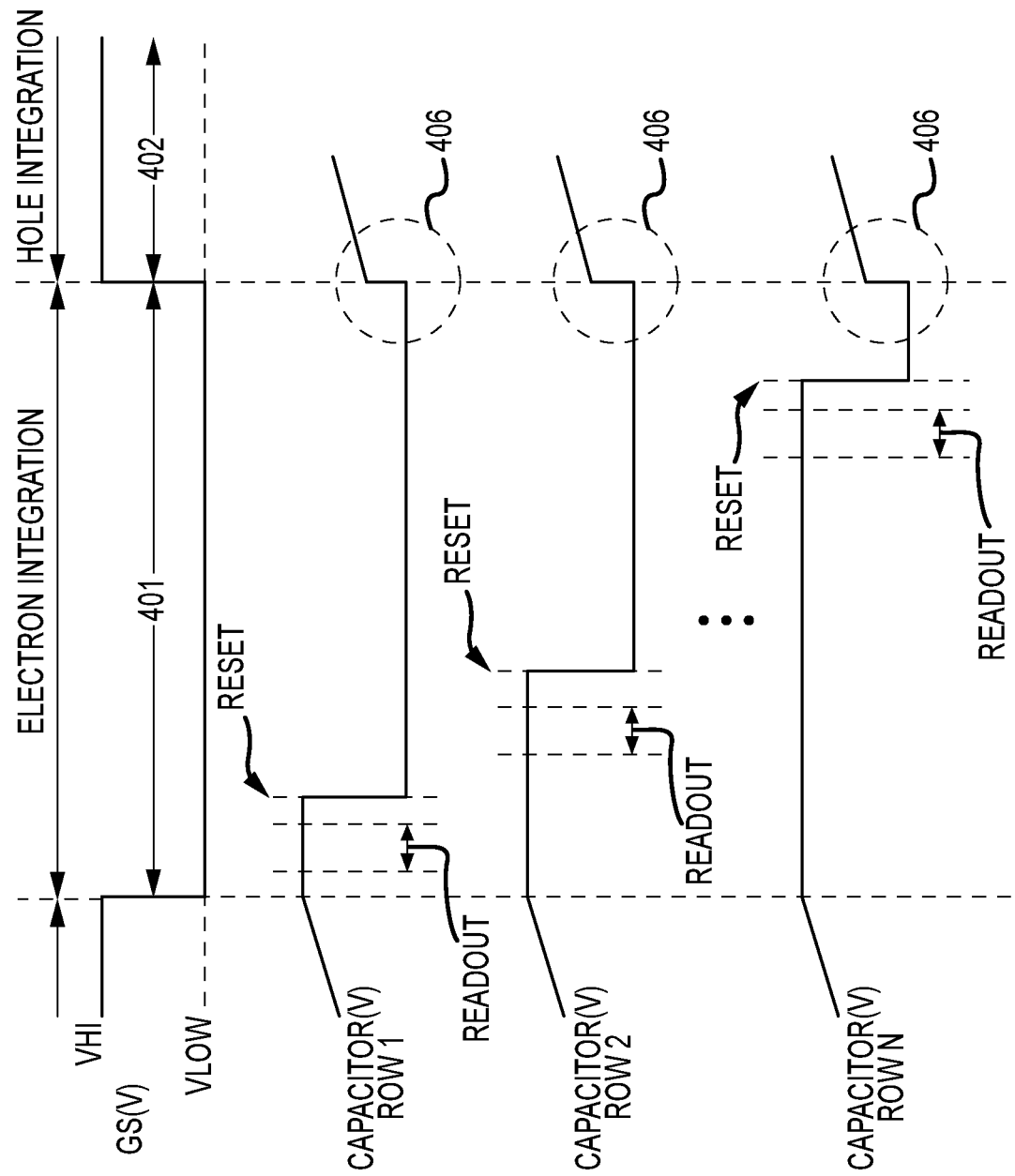
FIG. 4 is a timing diagram in accordance with an exemplary operation of the present technology.

According to various embodiments of the technology and referring to FIGS. 2-4, in operation, the electrons are integrated in the photodetector 201, such as the pinned photodiode, simultaneously as the holes are integrated in the pixel floating body region 325. The integrated holes are used for the detection of all levels of illumination signal and the corresponding hole charge is stored in the vertically-oriented deep trench isolation capacitors. The electrons are temporarily stored in the photodetector 201, for example a pinned photodiode, and are used for controlling global shutter exposure timing during the sequential readout of signal stored on the capacitors. Accordingly, the image sensor 145 provides high performance HDR operation in a global shutter scanning mode (global shutter operation).

In an exemplary operation, the pixel circuit 200 operates in the global shutter scanning mode, that is all pixels circuits 200 in the array integrate charge at the same time interval and then the charge is read out in a row-by-row manner.

In general, the photodetector 201 accumulates and stores charge generated by the photons 229 that impinge on the pixels of the array. According to an exemplary operation, the global shutter GS signal is switched to a low bias level $V_{LOW}$ (i.e., at interval 401) to facilitate electron integration (collection) in each photodetector 201 from each pixel circuit 200 simultaneously. During this time interval (401) no holes flow to the capacitors and the voltage levels on the capacitors stay constant and are ready for readout. A signal voltage level ($V_{OUT}$), corresponding to hole-generated charge, appears on the capacitor 209 and is read out through the row select transistor 208 and the column sense line 221.

During capacitor readout, the row select transistor 208 is turned on, for example by applying a HIGH row select signal $S_X$. This operation connects the drain terminal of the amplifying transistor 207 to the column sense line 221, which is biased by the current source 222. According to various modes of operation, a negative pre-charge pulse may be applied to the floating body FB through the pre-charge capacitor 220 prior to turning on the row select transistor 208. The signal ($V_{OUT}$) may then be transferred to the periphery of the array and converted to a digital equivalent. The row select transistor 208 is then turned off and each subsequent row of pixels is addressed and processed sequentially in the same manner.

After the signal voltage level on each capacitor is read out, the floating body FB node and the capacitor 209 are then reset by momentarily turning on the reset transistor 205. For example, the reset signal $R_X$ may be pulsed. The row select transistor 208 may then remain off for the duration of the array readout where the remaining rows of pixels are readout and processed in the same manner as described above.

According to an exemplary embodiment, the voltage on the capacitors are read out and reset sequentially in a row-by-row manner. For example, a capacitor in row 1 is read out and reset first, a capacitor in row 2 is read out and reset next, etc. This process of reading out and resetting the signal voltage level on the capacitors continues for N rows, where N is the last row in the array.

In various embodiments, the voltage level of the capacitor 209 may be sampled again (not shown) in a CDS scheme and used as a reference in various signal processing circuits and/or methods to reduce non-uniformity among the pixels readout circuits, such as the second portion 245. In addition, an active reset of the pixel floating body FB and capacitor 209 may be performed with the feedback capacitor 215 and the amplifying transistor 207 by applying a suitably-shaped reset pulse to the gate terminal of the reset transistor 205 to provide suppression of kTC reset noise. The reset noise reduction may be achieved using any suitable amplifier with a negative feedback.

During the readout period for all rows of pixels, light is still impinging on the image sensor 145 and generating and collecting electrons in the photodetector 201. After the readout of all rows is complete, the charge transfer device 203 is turned on by switching the global shutter GS signal to a high bias level $V_{HI}$ (i.e., at interval 402) and the electron charge is immediately drained out of the photodetector 201 and to the drain terminal of the charge transfer device 203. At the same time, the corresponding hole charge is transferred and stored on the capacitors resulting in a voltage step 406 on each capacitor. The voltage on each capacitor 209 will continue to increase gradually as more holes flow to the capacitor 209. Again, as described above, the charge transfer device 203 is turned off (globally for all pixels in the array at the same time) and the hole charge-generated voltage on each capacitor 209 stops increasing, making it ready for a subsequent readout.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment wherein the described pixels are formed in the p-type doped semiconductor epitaxial layer with the n+ type doped FD wherein the pinned photodiode collects electrons and the hole signal is sensed on a capacitor connected to the floating body. The polarity of the entire pixel structure, the substrate material and the junctions, can be reversed such that the pixel is formed in the n-type doped semiconductor epitaxial layer with the p+ type doped FD wherein the pinned photodiode collects holes and the electron signal is sensed on a capacitor connected to the floating body.

However, changes and modifications may be made to the exemplary embodiment without departing from the scope of the present technology. These and other changes or modifications are intended to be included within the scope of the present technology, as expressed in the following claims.

The invention claimed is:

1. A solid-state stacked chip image sensor, comprising:
an array of pixel circuits, each pixel circuit comprising:
an epitaxial layer comprising:
a pixel body having a first major surface and an opposing second major surface, and comprising:
a photodiode;
a floating body region;
a p+ type doped region along opposing sidewalls and adjacent to the second major surface of the pixel body;
a trench region extending from the first major surface to the second major surface of the epitaxial layer, wherein the trench region comprises:
an oxide layer deposited on opposing vertical sidewalls of the trench region; and
a center portion disposed between the opposing oxide layers, wherein the center portion comprises an electrically conductive material and is connected to a ground potential;

a charge transfer structure disposed at least partially within the epitaxial layer, wherein the charge transfer structure comprises a drain and is configured to divert electron charge from the photodiode to the drain; and a readout circuit connected to the floating body region;

wherein each pixel circuit is formed across a plurality of chips.

2. The solid-state stacked chip image sensor according to claim 1, wherein the solid-state image sensor comprises a first chip stacked vertically with a second chip.

3. The solid-state stacked chip image sensor according to claim 2, wherein:

the first chip comprises the epitaxial layer and the charge transfer structure; and the second chip comprises the readout circuit.

4. The solid-state stacked chip image sensor according to claim 2, wherein the first chip and the second chip are bonded together with a hybrid bond pad; and wherein the hybrid bond pad is:

disposed between the first major surface of the epitaxial layer and the second chip; and substantially overlaps the photodiode.

5. The solid-state stacked chip image sensor according to claim 1, where each pixel further comprises a color filter and a micro lens disposed adjacent to the second major surface of the epitaxial layer.

6. The solid-state stacked chip image sensor according to claim 1, wherein the image sensor is configured as a backside illuminated image sensor.

7. The solid-state stacked chip image sensor according to claim 1, wherein the readout circuit comprises:

a source follower transistor connected to the floating body region;

a feedback capacitor connected to the source follower transistor;

a row select transistor connected to a source terminal of the source follower transistor and responsive to a row select signal; and a pre-charge capacitor connected to the floating body node and responsive to a pre-charge signal.

* * * * *